United States Patent
Kim

(10) Patent No.: US 9,305,621 B2
(45) Date of Patent: Apr. 5, 2016

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventor: Min Su Kim, Busan (KR)

(73) Assignee: SK Hynix Inc., Gyeonggi-do (KR)

( * ) Notice: Subject to any disclaimer, the term of this patent is extended or adjusted under 35 U.S.C. 154(b) by 78 days.

(21) Appl. No.: 14/488,428

(22) Filed: Sep. 17, 2014

(65) Prior Publication Data

US 2015/0332744 A1 Nov. 19, 2015

(30) Foreign Application Priority Data

May 16, 2014 (KR) ........................ 10-2014-0059260

(51) Int. Cl.
| | |
|---|---|
| *G11C 11/4091* | (2006.01) |
| *G11C 7/22* | (2006.01) |
| *G11C 7/06* | (2006.01) |
| *G11C 7/10* | (2006.01) |
| *G11C 7/12* | (2006.01) |
| *G11C 8/10* | (2006.01) |
| *G11C 8/18* | (2006.01) |
| *G11C 8/12* | (2006.01) |

(52) U.S. Cl.
CPC .................. *G11C 7/22* (2013.01); *G11C 7/062* (2013.01); *G11C 7/10* (2013.01); *G11C 7/12* (2013.01); *G11C 8/10* (2013.01); *G11C 8/12* (2013.01); *G11C 8/18* (2013.01); *G11C 7/06* (2013.01); *G11C 7/065* (2013.01); *G11C 11/4091* (2013.01)

(58) Field of Classification Search
CPC ....... G11C 11/4091; G11C 7/065; G11C 7/06
USPC ................................ 365/205, 230.06, 185.25
See application file for complete search history.

(56) References Cited

U.S. PATENT DOCUMENTS

| 8,400,855 B2 | 3/2013 | Nakagawa et al. | |
|---|---|---|---|
| 2004/0022109 A1* | 2/2004 | Yoon ........................ | H01L 27/11 365/205 |

FOREIGN PATENT DOCUMENTS

KR  1020060119066 A  11/2006

* cited by examiner

*Primary Examiner* — Jason Lappas
(74) *Attorney, Agent, or Firm* — William Park & Associates Ltd.

(57) ABSTRACT

Semiconductor systems are provided. The semiconductor system may include a controller and a semiconductor device. The controller may generate command signals and address signals. The semiconductor device may discharge electric charges of a first local line pair and a second local line pair during a predetermined period after a read operation begins according to a combination of the command signals, equalize and pre-charge levels of the first and second local line pairs when a pre-charge operation is executed or the address signals are inputted thereto. The semiconductor device may also sense and amplify data loaded on the first or second local line pair to output the amplified data through an input/output line after the read operation begins.

21 Claims, 7 Drawing Sheets

SEMICONDUCTOR DEVICES AND SEMICONDUCTOR SYSTEMS INCLUDING THE SAME

CROSS-REFERENCE TO RELATED APPLICATION

The present application claims priority under 35 U.S.C 119(a) to Korean Application No. 10-2014-0059260, filed on May 16, 2014, in the Korean Intellectual Property Office, which is incorporated herein by reference in its entirety as set forth in full.

BACKGROUND

1. Technical Field

Embodiments of the present disclosure generally relate to semiconductor devices and semiconductor systems including the same.

2. Related Art

Semiconductor devices may execute a write operation to store data therein and may execute a read operation to output the data stored therein. In order to execute the write operation or the read operation, the semiconductor devices may selectively enable a word line using a row address signal to create a row path or may turn on a switching element coupled between a sense amplifier and an input/output (I/O) line using a column selection signal generated by a column address signal to create a column path.

Each of the semiconductor devices may be designed to include a plurality of I/O lines for outputting data. During a read operation, each sense amplifier may sense and amplify a voltage difference ($\Delta V$) between a pair of I/O lines selected by the column address signal to output the data.

During the read operation of the semiconductor device, at least one of the plurality of I/O lines may be selected by the column address signal while the remaining I/O lines may be non-selected or may not be selected. In such a case, a loading capacitance between the selected I/O line and the non-selected I/O lines adjacent thereto may degrade the function of the sense amplifier. This degradation may lead to an increase in the data access times of the semiconductor device.

SUMMARY

According to various embodiments, a semiconductor device may include a command decoder suitable for decoding command signals and for generating a read signal that may be enabled for execution of a read operation, an address decoder suitable for decoding address signals and for generating internal address signals, and a control signal generator suitable for generating a control signal that may be enabled during a predetermined period in response to the read signal. The semiconductor device may also include an input/output controller suitable for generating an input control signal in response to the read signal and suitable for generating a first group of column selection signals and a second group of column selection signals, and a data input/output unit suitable for equalizing and pre-charging first and second local line pairs if a pre-charge operation is executed or the address signals are inputted to the address decoder and suitable for sensing and amplifying data loaded on the first or second local line pair to output the amplified data through an input/output line. One column selection signal among the first and second groups of column selection signals may be selectively enabled according to a combination of the internal address signals, and the data input/output unit may be suitable for discharging electric charges of the first and second local line pairs in response to the control signal. Wherein the read signal is enabled for execution of the read operation, and the control signal is enabled during the predetermined period in response to the read signal.

According to embodiments, wherein the data input/output unit electrically disconnects the first local line pair from the second local line pair in response to the input control signal.

According to embodiments, the semiconductor device may include a isolator, wherein the isolator is coupled between the first local line pair and the second local line pair and is configured to include a first switching element and a second switching element which are turned on in response to the input control signal.

According to further embodiments, a semiconductor system may include a controller and a semiconductor device. The controller may be suitable for generating command signals and address signals. The semiconductor device may be suitable for discharging electric charges of a first local line pair and a second local line pair during a predetermined period from a point of time that a read operation begins according to a combination of the command signals. The semiconductor device may be suitable for equalizing and pre-charging levels of the first and second local line pairs when a pre-charge operation is executed or the address signals are inputted thereto. The semiconductor device may be suitable for sensing and amplifying data loaded on the first or second local line pair to output the amplified data through an input/output line after the point of time that the read operation begins.

According to embodiments, wherein the semiconductor device electrically disconnects the first local line pair from the second local line pair in response to an input control signal that is enabled when the read operation begins.

According to embodiments, the semiconductor system may include a isolator, wherein the isolator is coupled between the first local line pair and the second local line pair and is configured to include a first switching element and a second switching element which are turned on in response to the input control signal.

DETAILED DESCRIPTION

Various embodiments will be described hereinafter with reference to the accompanying drawings. However, the embodiments described herein are for illustrative purposes only and are not intended to limit the scope of the description.

Figure 1:
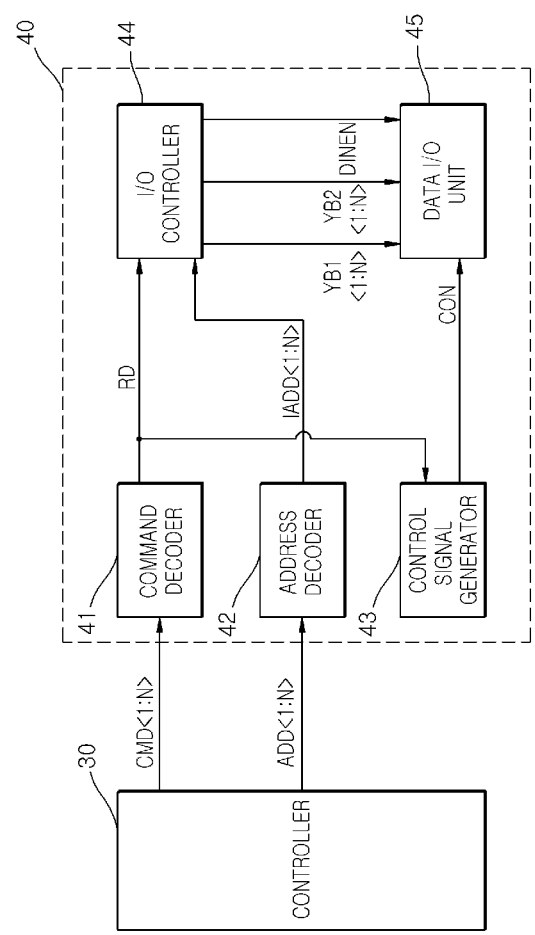
FIG. 1 is a block diagram illustrating a representation of a semiconductor system according to an embodiment.

As illustrated in FIG. 1, a semiconductor system according to an embodiment may be configured to include a controller 30 and a semiconductor device 40.

The controller 30 may generate command signals CMD<1:N> and address signals ADD<1:N> (where N may be a natural number greater than 1). The controller 30 may apply the command signals CMD<1:N> and the address signals ADD<1:N> to the semiconductor device 40.

The semiconductor device 40 may include a command decoder 41, an address decoder 42, and a control signal generator 43. The semiconductor device 40 may also include an input/output (I/O) controller 44 and a data I/O unit 45. The command decoder 41 may generate a read signal RD. The read signal RD may be enabled to execute a read operation according to a combination of the command signals CMD<1:N>. The address decoder 42 may decode the address signals ADD<1:N> to generate internal address signals IADD<1:N>. The control signal generator 43 may receive the read signal RD, and in response the control signal generator 43 may generate a control signal CON. The control signal CON may be enabled for a predetermined period or duration. The I/O controller 44 may generate an input control signal DINEN. The input control signal DINEN may be enabled in response to the read signal RD. In addition, the I/O controller 44 may generate a first group of column selection signals YB1<1:N> and a second group of column selection signals YB2<1:N>, one column selection signal of which may be selectively enabled according to the internal address signals IADD<1:N>. The data I/O unit 45 may sense and amplify data loaded on a first local line pair (LIO1 and LIO1B of FIG. 2) to output the amplified data to an I/O line (GIO of FIG. 2) if one of the first group of column selection signals YB1<1:N> is enabled. The data I/O unit 45 may sense and amplify data loaded on a second local line pair (LIO2 and LIO2B of FIG. 2) to output the amplified data to the I/O line GIO if one of the second group of column selection signals YB2<1:N> is enabled. In addition, if the control signal CON is enabled, the data I/O unit 45 may discharge electric charges of the first and second local line pairs LIO1, LIO1B, LIO2 and LIO2B. The input control signal DINEN may be disabled during a write operation.

A configuration of the data I/O unit 45 will be described hereinafter with reference to FIG. 2.

Figure 2:
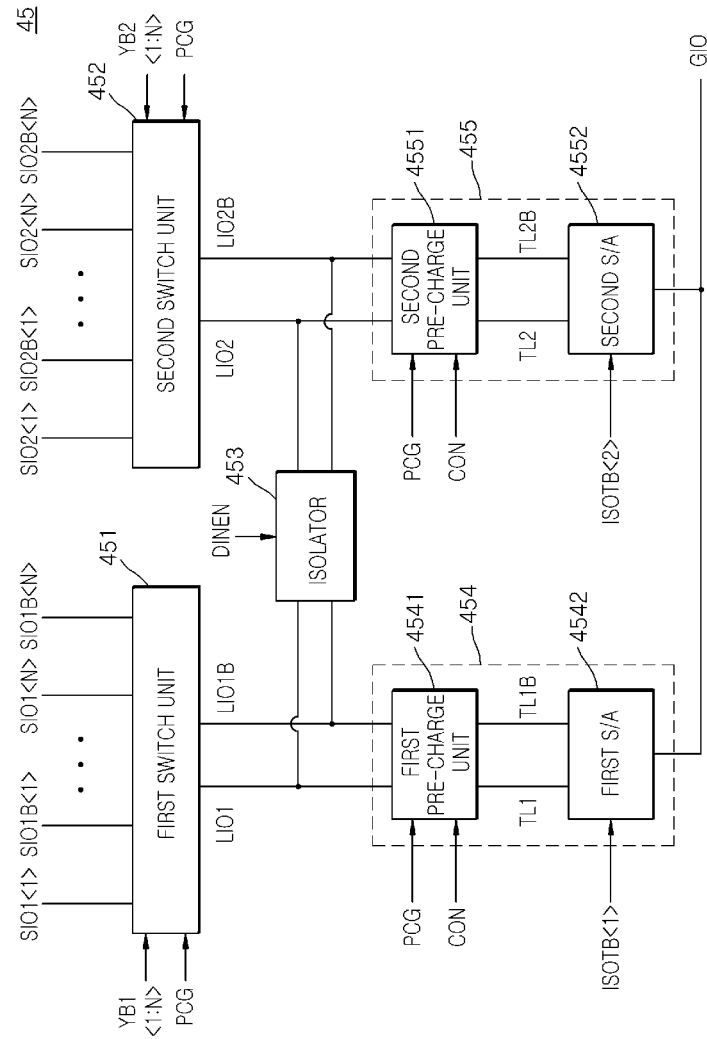
FIG. 2 is a block diagram illustrating a representation of a data I/O unit included in the semiconductor system of FIG. 1.

Referring to FIG. 2, the data I/O unit 45 may be configured to include a first switch unit 451, a second switch unit 452, and an isolator 453. The data I/O unit 45 may also be configured to include a first I/O line driver 454 and a second I/O line driver 455.

The first switch unit 451 may electrically connect a segment line pair, selected from a first group of segment lines SIO1<1>, SIO1B<1>, ... SIO1<N> and SIO1B<N>, to the first local line pair LIO1 and LIO1B in response to any one column selection signal enabled from among the first group of column selection signals YB1<1:N>. The first switch unit 451 may equalize levels of the first group of segment lines SIO1<1>, SIO1B<1>, ... SIO1<N> and SIO1B<N> for an equalization operation in response to an enabled pre-charge signal PCG. The pre-charge signal PCG may be enabled when the semiconductor device 40 (see FIG. 1) is under a pre-charge operation or the address signals ADD<1:N> are inputted to the semiconductor device 40. The first group of segment lines SIO1<1>, SIO1B<1>, ... SIO1<N> and SIO1B<N> may be data transmission lines that are electrically connected to memory cells to receive data supplied from an external device or to output the data stored in the memory cells to the external device. The segment lines SIO1B<1>, ... and SIO1B<N> among the first group of segment lines SIO1<1>, SIO1B<1>, ... SIO1<N> and SIO1B<N> may have complementary levels of respective ones of the segment lines SIO1<1>, ... and SIO1<N> among the first group of segment lines SIO1<1>, SIO1B<1>, ... SIO1<N> and SIO1B<N>.

More specifically, the equalization operation may be an operation for electrically connecting the segment lines SIO1<1>, ... and SIO1<N> to the corresponding complementary segment lines SIO1B<1>, ... and SIO1B<N>.

The second switch unit 452 may electrically connect a segment line pair, selected from a second group of segment lines SIO2<1>, SIO2B<1>, ... SIO2<N> and SIO2B<N>, to the second local line pair LIO2 and LIO2B in response to any one column selection signal enabled from among the second group of column selection signals YB2<1:N>. If the pre-charge signal PCG is enabled, the second switch unit 452 may equalize levels of the second group of segment lines SIO2<1>, SIO2B<1>, ... SIO2<N> and SIO2B<N> for the equalization operation. The second group of segment lines SIO2<1>, SIO2B<1>, ... SIO2<N> and SIO2B<N> may be data transmission lines that are electrically connected to the memory cells to receive data supplied from an external device or to output the data stored in the memory cells to the external device. The segment lines SIO2B<1>, ... and SIO2B<N> among the second group of segment lines SIO2<1>, SIO2B<1>, ... SIO2<N> and SIO2B<N> may have complementary levels of respective ones of the segment lines SIO2<1>, ... and SIO2<N> among the second group of segment lines SIO2<1>, SIO2B<1>, ... SIO2<N> and SIO2B<N>.

The isolator 453 may electrically disconnect the first local line pair LIO1 and LIO1B from the second local line pair LIO2 and LIO2B in response to the enablement of the input control signal DINEN. The input control signal may be enabled during the read operation.

The first I/O line driver 454 may be configured to include a first pre-charge unit 4541 and a first sense amplifier (S/A) 4542.

The first pre-charge unit 4541 may equalize the levels of the first local line pair LIO1 and LIO1B and may pre-charge the first local line pair LIO1 and LIO1B to a level which is lower than that of a power supply voltage if the pre-charge signal PCG is enabled. If the control signal CON is enabled, the first pre-charge unit 4541 may discharge the electric charges of the first local line pair LIO1 and LIO1B. In addition, the first pre-charge unit 4541 may drive a first transmission line pair TL1 and TL1B to have levels, which are lower than levels of the first local line pair LIO1 and LIO1B, during the read operation. The first local line LIO1B may have a complementary level of the first local line LIO1. The first transmission line TL1B may have a complementary level of the first transmission line TL1.

The first S/A 4542 may receive a first S/A enablement signal ISOTB<1>. The first S/A enablement signal ISOTB<1> may be enabled during the read operation to sense and amplify a voltage difference ($\Delta V$) between the first transmission line pair TL1 and TL1B and to output a datum corresponding to the amplified voltage difference through an I/O line GIO.

The second I/O line driver 455 may be configured to include a second pre-charge unit 4551 and a second sense amplifier (S/A) 4552.

The second pre-charge unit 4551 may equalize the levels of the second local line pair LIO2 and LIO2B and may pre-charge the second local line pair LIO2 and LIO2B to a level which is lower than that of the power supply voltage if the pre-charge signal PCG is enabled. If the control signal CON is enabled, the second pre-charge unit 4551 may discharge the electric charges of the second local line pair LIO2 and LIO2B. In addition, the second pre-charge unit 4551 may drive a second transmission line pair TL2 and TL2B to have levels, which are lower than levels of the second local line pair LIO2 and LIO2B, during the read operation. The second local line LIO2B may have a complementary level of the second local line LIO2. The second transmission line TL2B may have a complementary level of the second transmission line TL2.

The second S/A 4552 may receive a second S/A enablement signal ISOTB<2>. The second S/A enablement signal ISOTB<2> may be enabled during the read operation to sense and amplify a voltage difference ($\Delta V$) between the second transmission line pair TL2 and TL2B and to output a datum corresponding to the amplified voltage difference through the I/O line GIO.

A configuration of the first switch unit 451 will be described more fully hereinafter with reference to FIG. 3.

Figure 3:
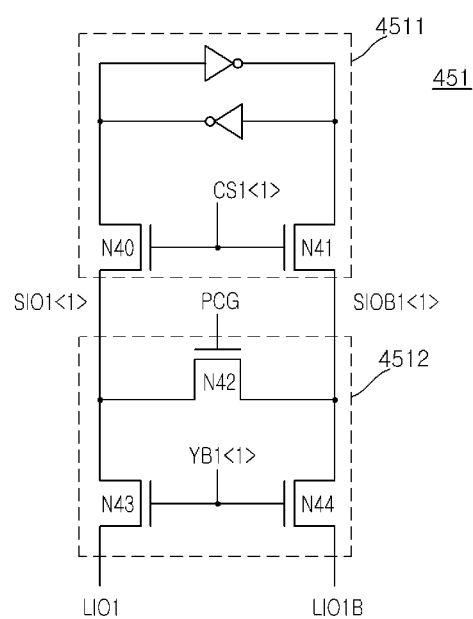
FIG. 3 is a circuit diagram illustrating a representation of a first switch unit included in the data I/O unit of FIG. 2.

Referring to FIG. 3, the first switch unit 451 may include a latch unit 4511 and a data transmission unit 4512.

The latch unit 4511 may be configured to include NMOS transistors N40 and N41. The NMOS transistors N40 and N41 may be turned on to transfer data to the segment line pair SIO1<1> and SIO1B<1> if a selection signal CS1<1> is enabled to have a logic "high" level. The selection signal CS1<1> may be a signal which is enabled to output the data to the segment line pair SIO1<1> and SIO1B<1> during the read operation.

The data transmission unit 4512 may be configured to include NMOS transistors N42, N43, and N44. The NMOS transistor N42 may be turned on to equalize the levels of the segment line pair SIO1<1> and SIO1B<1> if the pre-charge signal PCG is enabled to have a logic "high" level. The NMOS transistors N43 and N44 may be turned on to transmit data loaded on the segment line pair SIO1<1> and SIO1B<1> to the first local line pair LIO1 and LIO1B if the column selection signal YB1<1> among the first group of column selection signals YB1<1:N> is enabled. The column selection signal YB1<1> may be a signal which is enabled to transmit the data loaded on the segment line pair SIO1<1> and SIO1B<1> to the first local line pair LIO1 and LIO1B during the read operation.

Although FIG. 3 illustrates an example in which the first switch unit 451 electrically connects the segment line pair SIO1<1> and SIO1B<1> to the first local line pair LIO1 and LIO1B, the embodiments are not limited to the example shown in FIG. 3. That is, the first switch unit 451 may be configured to electrically connect any one segment line pair among the first group of segment lines SIO1<1>, SIO1B<1>, . . . SIO1<N> and SIO1B<N> to the first local line pair LIO1 and LIO1B according to the column selection signal enabled from among the first group of column selection signals YB1<1:N>. The second switch unit 452 (See FIG. 2) may be realized to have substantially the same configuration as the first switch unit 451. Thus, a detailed description of the second switch unit 452 will be omitted hereinafter.

A configuration of the isolator 453 as referenced in FIG. 2 will be described more fully hereinafter with reference to FIG. 4.

Figure 4:
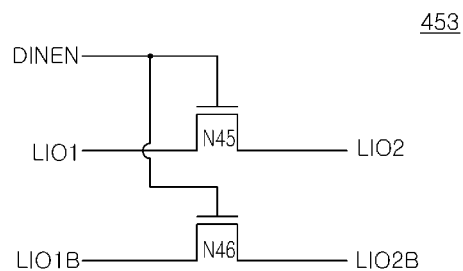
FIG. 4 is a circuit diagram illustrating a representation of an isolator included in the data I/O unit of FIG. 2.

Referring to FIG. 4, the isolator 453 may be configured to include a first switching element N45 and a second switching element N46. The first switching element N45 may include an NMOS transistor. In the case of an NMOS transistor, the NMOS transistor may be turned off in response to the enablement of the input control signal DINEN. The input control signal DINEN may be enabled to have a logic "low" level to electrically disconnect the first local line LIO1 from the second local line LIO2, during the read operation. The second switching element N46 may include an NMOS transistor. In the case of an NMOS transistor, the NMOS transistor may be turned off in response to the enablement of the input control signal DINEN. The input control signal DINEN may be enabled to have a logic "low" level to electrically disconnect the first complementary local line LIO1B from the second complementary local line LIO2B, during the read operation. That is, during the read operation, the isolator 453 may electrically disconnect the first local line pair LIO1 and LIO1B from the second local line pair LIO2 and LIO2B.

A configuration of the first pre-charge unit 4541 will be described hereinafter with respect to FIG. 5.

Figure 5:
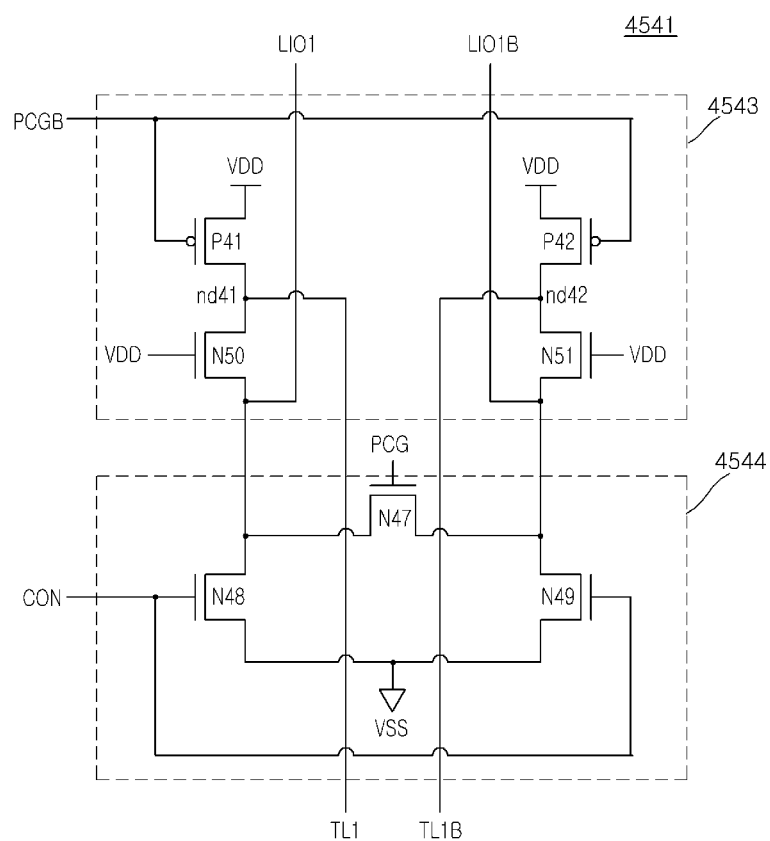
FIG. 5 is a circuit diagram illustrating a representation of a first pre-charge unit included in the data I/O unit of FIG. 2.
Figure 6:
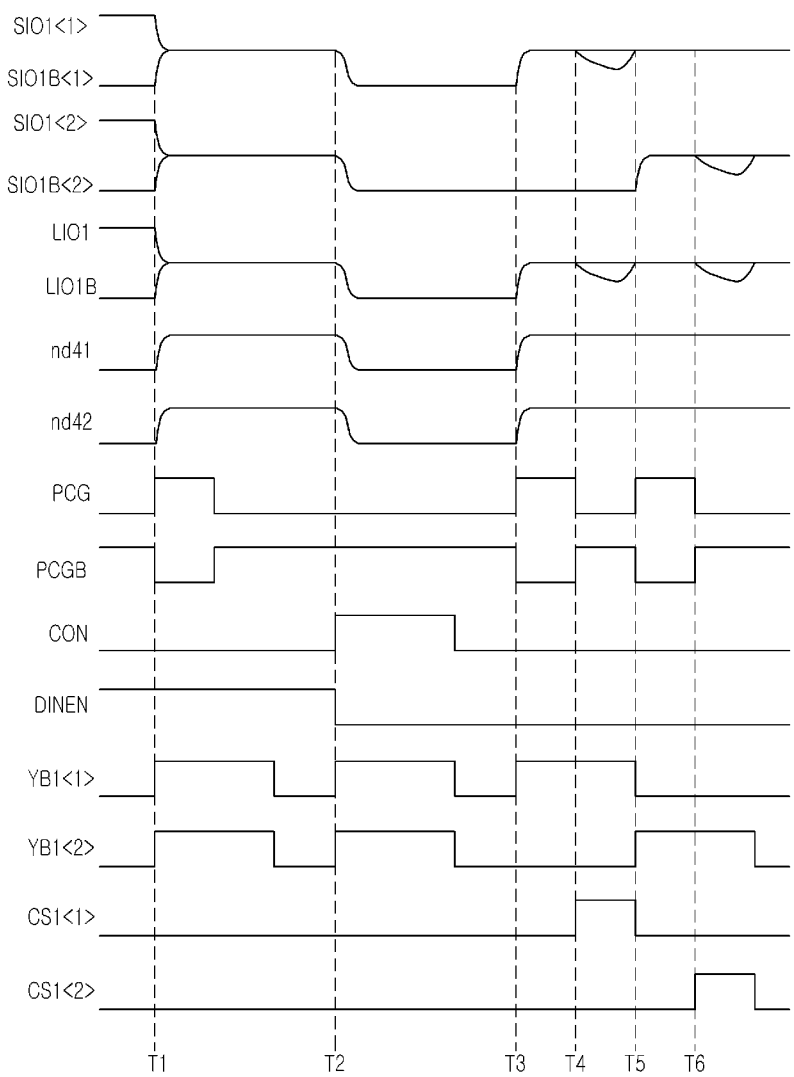
FIG. 6 is a timing diagram illustrating a representation of an operation of a semiconductor system according to an embodiment.

Referring to FIG. 5, the first pre-charge unit 4541 may include a discharger 4544 and a line driver 4543.

The discharger 4544 may be configured to include NMOS transistors N47, N48 and N49. The NMOS transistor N47 may be turned on to equalize the levels of the first local line pair LIO1 and LIO1B if the pre-charge signal PCG is enabled to have a logic "high" level. The NMOS transistors N48 and N49 may be turned on to discharge electric charges of the first local line pair LIO1 and LIO1B into a ground voltage VSS terminal if the control signal CON is enabled to have a logic "high" level. That is, the discharger 4544 may equalize the levels of the first local line pair LIO1 and LIO1B when the semiconductor device 40 is under a pre-charge operation or the address signals ADD<1:N> (See FIG. 1) are inputted to the semiconductor device 40 and may discharge the electric charges of the first local line pair LIO1<1> and LIO1B<1> into the ground voltage VSS terminal during a predetermined period from a point of time that the read operation begins.

The line driver 4543 may include a PMOS transistor P41 coupled between a power supply voltage VDD terminal and a node ND41. The node ND41 may be connected to the first transmission line TL1. A first drive element N50 may be coupled between the node ND41 and the first local line LIO1. A PMOS transistor P42 may be coupled between the power supply voltage VDD terminal and a node ND42. The node ND42 may be connected to the first complementary transmission line TL1B. A second drive element N51 may be coupled between the node ND42 and the first complementary local line LIO1B. In various embodiments, the first and second drive elements N50 and N51 may be NMOS transistors. The PMOS transistors P41 and P42 may be turned on to drive the nodes ND41 and ND42 to the power supply voltage VDD if a complementary pre-charge signal PCGB is enabled to have a logic "low" level. The first drive element N50 may be turned on in response to the power supply voltage VDD to drive the first transmission line TL1 to a level which is lower than a level of the first local line LIO1 by a threshold voltage (Vth) thereof. The second drive element N51 may be turned on in response to the power supply voltage VDD to drive the first complementary transmission line TL1B to a level which is lower than a level of the first complementary local line LIO1B by a threshold voltage (Vth) thereof. The complementary pre-charge signal PCGB may be a signal having a complementary level of the pre-charge signal PCG. That is, the line driver 4543 may drive the first local line pair LIO1 and LIO1B to a level which is lower than a level of the power supply voltage VDD by a threshold voltage (Vth) of the first and second drive elements N50 and N51 at a point of time at which the semiconductor device 40 (See FIG. 1) is under the pre-charge operation or the address signals ADD<1:N> are inputted to the semiconductor device 40 and may drive the first transmission line pair TL1 and TL1B to levels which are lower than levels of the first local line pair LIO1 and LIO1B by a threshold voltage (Vth) of the first and second drive elements N50 and N51 during the read operation.

The second pre-charge unit 4551 may be realized to have substantially the same configuration as the first pre-charge unit 4541. Thus, a detailed description of the second pre-charge unit 4551 will be omitted hereinafter.

An operation of the semiconductor system having the aforementioned configuration will now be described with respect to FIGS. 1 to 6 in conjunction with the pre-charge operation and the read operation. It is assumed here that the read operation outputs data loaded on the first local line LIO1 by an address signal to the I/O line GIO.

First, the pre-charge operation will be described hereinafter.

At a point of time "T1", if the pre-charge operation is executed, the data transmission unit 4512 of the first switch unit 451 may receive the pre-charge signal PCG enabled to have a logic "high" level to equalize and pre-charge the levels of the first group of segment lines SIO1<1>, SIO1B<1>, . . . SIO1<N> and SIO1B<N>.

To equalize the first local line pair LIO1 and LIO1B, the discharger 4544 of the first pre-charge unit 4541 may receive the pre-charge signal PCG having a logic "high" level.

The PMOS transistors P41 and P42 of the line driver 4543 of the first pre-charge unit 4541 may be turned on in response to the complementary pre-charge signal PCGB having a logic "low" level to drive the nodes ND41 and ND42 to the power supply voltage VDD during the pre-charge operation. In addition, the line driver 4543 may drive the first local line LIO1 to a voltage level which is lower than a voltage level of the node ND41 by a threshold voltage (Vth) of the first drive element N50 and may drive the first complementary local line LIO1B to a voltage level which is lower than a voltage level of the node ND42 by a threshold voltage (Vth) of the second drive element N51.

Next, the read operation will be described hereinafter.

At a point of time "T2", the command decoder 41 may generate the read signal RD. The read signal RD may be enabled if the read operation is executed according to a combination of the command signals CMD<1:N>.

However, the address decoder 42 does not generate the internal address signals IADD<1:N> because the address signals ADD<1:N> are not inputted to address decoder 42.

The control signal generator 43 may receive the read signal RD to generate the enabled control signal CON having a logic "high" level.

The I/O controller 44 may receive the read signal RD to generate the enabled input control signal DINEN having a logic "low" level. In such cases, the I/O controller 44 may generate the first and second groups of column selection signals YB1<1:N> and YB2<1:N> having a logic "high" level.

The first switch unit 451 of the data I/O unit 45 may receive the first group of column selection signals YB1<1:N> to electrically connect the first group of segment lines SIO1<1>, SIO1B<1>, . . . SIO1<N> and SIO1B<N> to the first local line pair LIO1 and LIO1B. The second switch unit 452 may receive the second group of column selection signals YB2<1:N> to electrically connect the second group of segment lines SIO2<1>, SIO2B<1>, . . . SIO2<N> and SIO2B<N> to the second local line pair LIO2 and LIO2B. The isolator 453 may receive the input control signal DINEN having a logic "low" level to electrically disconnect the first local line pair LIO1 and LIO1B from the second local line pair LIO2 and LIO2B. The first I/O line driver 454 may receive the control signal CON having a logic "high" level to discharge the electric charges of the first local line pair LIO1 and LIO1B into the ground voltage VSS terminal. In such cases, electric charges of the nodes ND41 and ND42 may be discharged into the ground voltage VSS terminal, and electric charges of the first group of segment lines SIO1<1>, SIO1B<1>, . . . SIO1<N> and SIO1B<N> may also be discharged into the ground voltage VSS terminal. The second I/O line driver 455 may receive the control signal CON having a logic "high" level to discharge electric charges of the second local line pair LIO2 and LIO2B into the ground voltage VSS terminal. In such cases, electric charges of the second group of segment lines SIO2<1>, SIO2B<1>, . . . SIO2<N> and SIO2B<N> may also be discharged into the ground voltage VSS terminal.

At a point of time "T3", the address decoder 42 may decode the address signals ADD<1:N> to generate the internal address signals IADD<1:N>.

The control signal generator 43 may generate the control signal CON having a logic "low" level.

In response to the read signal RD, the I/O controller 44 may generate the input control signal DINEN having a logic "low" level. The I/O controller 44 may generate the column selection signal YB1<1> having a logic "high" level among the first group of column selection signals YB1<1:N> according to the internal address signals IADD<1:N>.

The first switch unit 451 of the data I/O unit 45 may receive the column selection signal YB1<1> having a logic "high" level to electrically connect the segment line pair SIO1<1> and SIO1B<1> to the first local line pair LIO1 and LIO1B. The second switch unit 452 may electrically disconnect the second group of segment lines SIO2<1>, SIO2B<1>, . . . SIO2<N> and SIO2B<N> from the second local line pair LIO2 and LIO2B because all of the second group of column selection signals YB2<1:N> are disabled. The isolator 453 may receive the input control signal DINEN having a logic "low" level to electrically disconnect the first local line pair LIO1 and LIO1B from the second local line pair LIO2 and LIO2B. The first I/O line driver 454 may receive the complementary pre-charge signal PCGB having a logic "low" level to drive the nodes ND41 and ND42 to the power supply voltage VDD and to pre-charge the first local line pair LIO1 and LIO1B to a level which is lower than the power supply voltage VDD by a threshold voltage (Vth) of the first and second drive elements N50 and N51. In such cases, the segment line pair SIO1<1> and SIO1B<1> may be driven to have the same level as the first local line pair LIO1 and LIO1B respectively because the segment line pair SIO1<1> and SIO1B<1> are respectively connected to the first local line pair LIO1 and LIO1B.

At a point of time "T4", the NMOS transistors N40, N41, N43 and N44 of the first switch unit 451 of the data I/O unit 45 may be turned on in response to the column selection signal YB1<1> having a logic "high" level and the selection signal CS1<1> having a logic "high" level to generate a voltage difference (ΔV) between the segment line pair SIO1<1> and SIO1B<1>. In such cases, the first local line pair LIO1 and LIO1B may be driven to have the same level as the segment line pair SIO1<1> and SIO1B<1> respectively because the first local line pair LIO1 and LIO1B are respectively connected to the segment line pair SIO1<1> and SIO1B<1>. The second switch unit 452 may electrically disconnect the second group of segment lines SIO2<1>, SIO2B<1>, . . . SIO2<N> and SIO2B<N> from the second local line pair LIO2 and LIO2B because all of the second group of column selection signals YB2<1:N> are disabled. The isolator 453 may receive the input control signal DINEN having a logic "low" level to electrically disconnect the first local line pair LIO1 and LIO1B from the second local line pair LIO2 and LIO2B. The first I/O line driver 454 may drive the first transmission line pair TL1 and TL1B to levels which are lower than the first local line pair LIO1 and LIO1B by a threshold voltage (Vth) of the first and second drive elements N50 and N51 and may sense and amplify a voltage difference (ΔV) between the first transmission line pair TL1 and TL1B to output a datum corresponding to the amplified voltage difference through the I/O line GIO.

At a point of time "T5", the address decoder 42 may decode the address signals ADD<1:N> to generate the internal address signals IADD<1:N>.

The control signal generator 43 may generate the control signal CON having a logic "low" level.

The I/O controller 44 may generate the input control signal DINEN having a logic "low" level in response to the read signal RD. The I/O controller 44 may generate the column selection signal YB1<2> having a logic "high" level among the first group of column selection signals YB1<1:N> according to the internal address signals IADD<1:N>.

The first switch unit 451 of the data I/O unit 45 may receive the column selection signal YB1<2> having a logic "high" level to electrically connect the segment line pair SIO1<2> and SIO1B<2> to the first local line pair LIO1 and LIO1B. The second switch unit 452 may electrically disconnect the second group of segment lines SIO2<1>, SIO2B<1>, ... SIO2<N> and SIO2B<N> from the second local line pair LIO2 and LIO2B because all of the second group of column selection signals YB2<1:N> are disabled. The isolator 453 may receive the input control signal DINEN having a logic "low" level to electrically disconnect the first local line pair LIO1 and LIO1B from the second local line pair LIO2 and LIO2B. The first I/O line driver 454 may receive the complementary pre-charge signal PCGB having a logic "low" level to drive the nodes ND41 and ND42 to the power supply voltage VDD and to pre-charge the first local line pair LIO1 and LIO1B to a level which is lower than the power supply voltage VDD by a threshold voltage (Vth) of the first and second drive elements N50 and N51. In such cases, the segment line pair SIO1<1> and SIO1B<1> may be driven to have the same level as the first local line pair LIO1 and LIO1B respectively because the segment line pair SIO1<1> and SIO1B<1> are respectively connected to the first local line pair LIO1 and LIO1B.

At a point of time "T6", the first switch unit 451 of the data I/O unit 45 may receive the column selection signal YB1<2> having a logic "high" level and the selection signal CS1<1> having a logic "high" level to generate a voltage difference (ΔV) between the segment line pair SIO1<2> and SIO1B<2>. In such cases, the first local line pair LIO1 and LIO1B may be driven to have the same level as the segment line pair SIO1<2> and SIO1B<2> respectively because the first local line pair LIO1 and LIO1B are respectively connected to the segment line pair SIO1<2> and SIO1B<2>. The second switch unit 452 may electrically disconnect the second group of segment lines SIO2<1>, SIO2B<1>, ... SIO2<N> and SIO2B<N> from the second local line pair LIO2 and LIO2B because all of the second group of column selection signals YB2<1:N> are disabled. The isolator 453 may receive the input control signal DINEN having a logic "low" level to electrically disconnect the first local line pair LIO1 and LIO1B from the second local line pair LIO2 and LIO2B. The first I/O line driver 454 may drive the first transmission line pair TL1 and TL1B to levels which are lower than the first local line pair LIO1 and LIO1B by a threshold voltage (Vth) of the first and second drive elements N50 and N51 and may sense and amplify a voltage difference (ΔV) between the first transmission line pair TL1 and TL1B to output a datum corresponding to the amplified voltage difference through the I/O line GIO.

Figure 7:
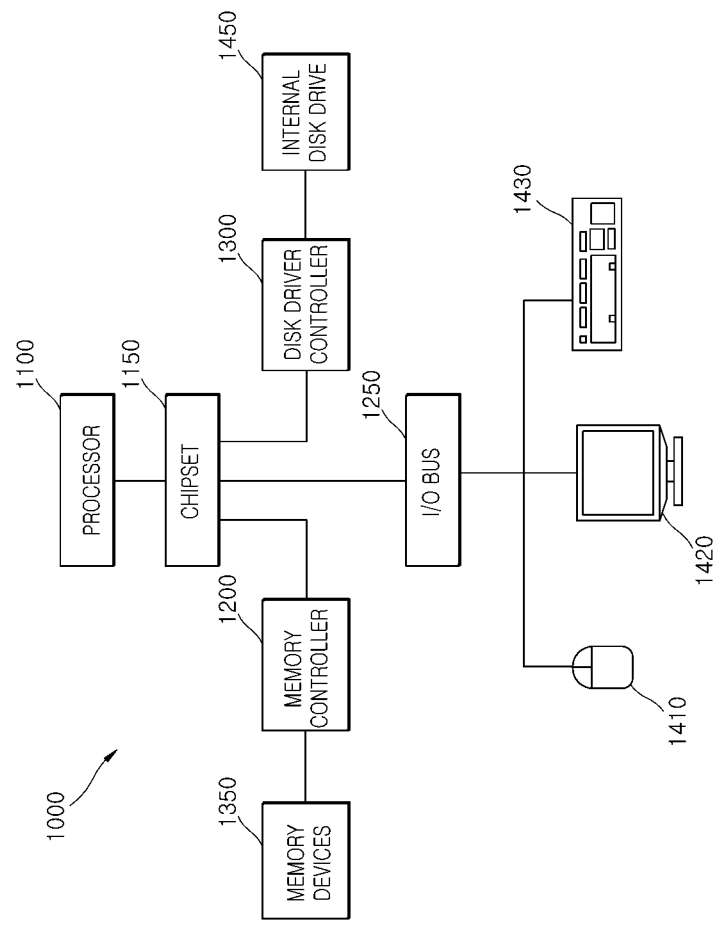
FIG. 7 illustrates a block diagram representation of an example of a system employing the semiconductor system in accordance with the embodiments discussed above with relation to FIGS. 1-6.

The semiconductor system discussed above is particular useful in the design of memory devices, processors, and computer systems. For example, referring to FIG. 7, a block diagram of a system employing the semiconductor system in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor system and/or controller 30 as discussed above with reference to FIGS. 1-6. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor system and/or semiconductor device 40 as discussed above with relation to FIGS. 1-6, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 7 is merely one example of a system employing the semiconductor system as discussed above with relation to FIGS. 1-6. In alternate embodiments, such as cellular phones or digital cameras, the components may differ from the embodiments illustrated in FIG. 7.

As described above, a semiconductor system according to the embodiments may discharge electric charges of a first local line pair and a second local line pair when a pre-charge operation is executed or an address signal is inputted and may electrically disconnect the first local line pair from the second local line pair during a read operation to reduce loading capacitance values of the first and second local line pairs. Thus, a sensing speed of sense amplifiers connected to the first and second local line pairs may be improved to reduce a data access time of the semiconductor system.

What is claimed is:

1. A semiconductor device comprising:
    a command decoder suitable for decoding command signals and for generating a read signal for execution of a read operation;
    an address decoder suitable for decoding address signals and for generating internal address signals;
    a control signal generator suitable for generating a control signal during a predetermined period in response to the read signal;
    an input/output controller suitable for generating an input control signal in response to the read signal and suitable for generating a first group of column selection signals and a second group of column selection signals, one column selection signal among the first and second groups of column selection signals being selectively enabled according to a combination of the internal address signals; and
    a data input/output unit suitable for equalizing and pre-charging first and second local line pairs if a pre-charge operation is executed or the address signals are inputted to the address decoder and suitable for sensing and amplifying data loaded on the first or second local line pair to output the amplified data through an input/output line,
    wherein the data input/output unit is suitable for discharging electric charges of the first and second local line pairs in response to the control signal.

2. The semiconductor device of claim 1, wherein the data input/output unit includes:
    a first switch unit suitable for equalizing levels of first group of segment lines in response to a pre-charge signal and suitable for electrically connecting the first group of segment lines to the first local line pair in response to the first group of column selection signals;
    a second switch unit suitable for equalizing levels of second group of segment lines in response to the pre-charge signal and suitable for electrically connecting the second group of segment lines to the second local line pair in response to the second group of column selection signals;
    an isolator suitable for electrically disconnecting the first local line pair from the second local line pair in response to the input control signal;
    a first input/output line driver suitable for discharging electric charges of the first local line pair in response to the control signal, suitable for driving a first transmission line pair to have levels lower than levels of the first local line pair during the read operation, and suitable for sensing and amplifying a voltage difference between the first transmission line pair to output a datum corresponding to the amplified voltage difference through the input/output line during the read operation; and
    a second input/output line driver suitable for discharging electric charges of the second local line pair in response to the control signal, suitable for driving a second transmission line pair to have levels lower than levels of the second local line pair during the read operation, and suitable for sensing and amplifying a voltage difference between the second transmission line pair to output a datum corresponding to the amplified voltage difference through the input/output line during the read operation.

3. The semiconductor device of claim 2, wherein the first input/output line driver includes:
    a first pre-charge unit suitable for equalizing levels of the first local line pair in response to the pre-charge signal, suitable for discharging electric charges of the first local line pair in response to the control signal, and suitable for transmitting data loaded on the first local line pair to the first transmission line pair; and
    a first sense amplifier suitable for sensing and amplifying a voltage difference between the first transmission line pair in response to a first sense/amplifier enablement signal that is enabled during the read operation to output a datum corresponding to the amplified voltage difference through the input/output line.

4. The semiconductor device of claim 3, wherein the first pre-charge unit includes:
    a first discharger suitable for equalizing levels of the first local line pair in response to the pre-charge signal and suitable for discharging electric charges of the first local line pair in response to the control signal; and
    a first line driver suitable for driving a first node and a second node to a level of a power supply voltage in response to a complementary pre-charge signal and suitable for driving the first transmission line pair to levels which are lower than levels of the first local line pair.

5. The semiconductor device of claim 4, wherein the first line driver includes:
    a first drive element coupled between a first local line of the first local line pair and the first node, the first node connected to a first transmission line of the first transmission line pair to lower a level of the first node by a threshold voltage of the first drive element; and
    a second drive element coupled between a first complementary local line of the first local line pair and the second node, the second node connected to a first complementary transmission line of the first transmission line pair to lower a level of the second node by a threshold voltage of the second drive element.

6. The semiconductor device of claim 5, wherein the first line driver is suitable for driving the first local line to a level which is lower than a level of the power supply voltage by a threshold voltage of the first drive element and suitable for driving the first complementary local line to a level which is lower than a level of the power supply voltage by a threshold voltage of the second drive element, during a pre-charge operation.

7. The semiconductor device of claim 2, wherein the second input/output line driver includes:
    a second pre-charge unit suitable for equalizing levels of the second local line pair in response to the pre-charge signal, suitable for discharging electric charges of the second local line pair in response to the control signal, and suitable for transmitting data loaded on the second local line pair to the second transmission line pair; and
    a second sense amplifier suitable for sensing and amplifying a voltage difference between the second transmission line pair in response to a second sense/amplifier enablement signal enabled during the read operation to output a datum corresponding to the amplified voltage difference through the input/output line.

8. The semiconductor device of claim 7, wherein the second pre-charge unit includes:
a second discharger suitable for equalizing levels of the second local line pair in response to the pre-charge signal and suitable for discharging electric charges of the second local line pair in response to the control signal; and
a second line driver suitable for driving a third node and a fourth node to a level of a power supply voltage in response to a complementary pre-charge signal and suitable for driving the second transmission line pair to levels which are lower than levels of the second local line pair.

9. The semiconductor device of claim 8, wherein the second line driver includes:
a third drive element coupled between a second local line of the second local line pair and the third node, the third node connected to a second transmission line of the second transmission line pair to lower a level of the third node by a threshold voltage of the third drive element; and
a fourth drive element coupled between a second complementary local line of the second local line pair and the fourth node, the fourth node connected to a second complementary transmission line of the second transmission line pair to lower a level of the fourth node by a threshold voltage of the fourth drive element.

10. The semiconductor device of claim 9, wherein the second line driver is suitable for driving the second local line to a level which is lower than a level of the power supply voltage by a threshold voltage of the third drive element and suitable for driving the second complementary local line to a level which is lower than a level of the power supply voltage by a threshold voltage of the fourth drive element, during a pre-charge operation.

11. A semiconductor system comprising:
a controller suitable for generating command signals and address signals; and
a semiconductor device suitable for discharging electric charges of a first local line pair and a second local line pair during a predetermined period from a point of time that a read operation begins according to a combination of the command signals, suitable for equalizing and pre-charging levels of the first and second local line pairs when a pre-charge operation is executed or the address signals are inputted thereto, and suitable for sensing and amplifying data loaded on the first or second local line pair to output the amplified data through an input/output line after the point of time that the read operation begins.

12. The semiconductor system of claim 11, wherein the semiconductor device includes:
a command decoder suitable for decoding the command signals to generate a read signal that is enabled for execution of the read operation;
an address decoder suitable for decoding the address signals to generate internal address signals;
a control signal generator suitable for generating a control signal that is enabled during a predetermined period in response to the read signal;
an input/output controller suitable for generating an input control signal in response to the read signal and suitable for generating a first group of column selection signals and a second group of column selection signals, one column selection signal among the first and second groups of column selection signals being selectively enabled according to a combination of the internal address signals; and
a data input/output unit suitable for sensing and amplifying data loaded on the first local line pair to output the amplified data through the input/output line if one of the first group of column selection signals is enabled and suitable for sensing and amplifying data loaded on the second local line pair to output the amplified data through the input/output line if one of the second group of column selection signals is enabled,
wherein the data input/output unit is suitable for discharging electric charges of the first and second local line pairs in response to the control signal.

13. The semiconductor system of claim 12, wherein the data input/output unit includes:
a first switch unit suitable for equalizing levels of first group of segment lines in response to a pre-charge signal and suitable for electrically connecting the first group of segment lines to the first local line pair in response to the first group of column selection signals;
a second switch unit suitable for equalizing levels of second group of segment lines in response to the pre-charge signal and suitable for electrically connecting the second group of segment lines to the second local line pair in response to the second group of column selection signals;
an isolator suitable for electrically disconnecting the first local line pair from the second local line pair in response to the input control signal;
a first input/output line driver suitable for discharging electric charges of the first local line pair in response to the control signal, suitable for driving a first transmission line pair to have levels lower than levels of the first local line pair during the read operation, and suitable for sensing and amplifying a voltage difference between the first transmission line pair to output a datum corresponding to the amplified voltage difference through the input/output line during the read operation; and
a second input/output line driver suitable for discharging electric charges of the second local line pair in response to the control signal, suitable for driving a second transmission line pair to have levels lower than levels of the second local line pair during the read operation, and suitable for sensing and amplifying a voltage difference between the second transmission line pair to output a datum corresponding to the amplified voltage difference through the input/output line during the read operation.

14. The semiconductor system of claim 13, wherein the first input/output line driver includes:
a first pre-charge unit suitable for equalizing levels of the first local line pair in response to the pre-charge signal, suitable for discharging electric charges of the first local line pair in response to the control signal, and suitable for transmitting data loaded on the first local line pair to the first transmission line pair; and
a first sense amplifier suitable for sensing and amplifying a voltage difference between the first transmission line pair in response to a first sense/amplifier enablement signal that is enabled during the read operation to output a datum corresponding to the amplified voltage difference through the input/output line.

15. The semiconductor system of claim 14, wherein the first pre-charge unit includes:
a first discharger suitable for equalizing levels of the first local line pair in response to the pre-charge signal and suitable for discharging electric charges of the first local line pair in response to the control signal; and a first line driver suitable for driving a first node and a second node to a level of a power supply voltage in response to a complementary pre-charge signal and suitable for driving the first transmission line pair to levels which are lower than levels of the first local line pair.

16. The semiconductor system of claim 15, wherein the first line driver includes:

a first drive element coupled between a first local line of the first local line pair and the first node, the first node connected to a first transmission line of the first transmission line pair to lower a level of the first node by a threshold voltage of the first drive element; and a second drive element coupled between a first complementary local line of the first local line pair and the second node, the second node connected to a first complementary transmission line of the first transmission line pair to lower a level of the second node by a threshold voltage of the second drive element.

17. The semiconductor system of claim 16, wherein the first line driver is suitable for driving the first local line to a level which is lower than a level of the power supply voltage by a threshold voltage of the first drive element and suitable for driving the first complementary local line to a level which is lower than a level of the power supply voltage by a threshold voltage of the second drive element, during a pre-charge operation.

18. The semiconductor system of claim 13, wherein the second input/output line driver includes:

a second pre-charge unit suitable for equalizing levels of the second local line pair in response to the pre-charge signal, suitable for discharging electric charges of the second local line pair in response to the control signal, and suitable for transmitting data loaded on the second local line pair to the second transmission line pair; and a second sense amplifier suitable for sensing and amplifying a voltage difference between the second transmission line pair in response to a second sense/amplifier enablement signal enabled during the read operation to output a datum corresponding to the amplified voltage difference through the input/output line.

19. The semiconductor system of claim 18, wherein the second pre-charge unit includes:

a second discharger suitable for equalizing levels of the second local line pair in response to the pre-charge signal and suitable for discharging electric charges of the second local line pair in response to the control signal; and a second line driver suitable for driving a third node and a fourth node to a level of a power supply voltage in response to a complementary pre-charge signal and suitable for driving the second transmission line pair to levels which are lower than levels of the second local line pair.

20. The semiconductor system of claim 19, wherein the second line driver includes:

a third drive element coupled between a second local line of the second local line pair and the third node, the third node connected to a second transmission line of the second transmission line pair to lower a level of the third node by a threshold voltage of the third drive element; and a fourth drive element coupled between a second complementary local line of the second local line pair and the fourth node, the fourth node connected to a second complementary transmission line of the second transmission line pair to lower a level of the fourth node by a threshold voltage of the fourth drive element.

21. The semiconductor system of claim 20, wherein the second line driver is suitable for driving the second local line to a level which is lower than a level of the power supply voltage by a threshold voltage of the third drive element and suitable for driving the second complementary local line to a level which is lower than a level of the power supply voltage by a threshold voltage of the fourth drive element, during a pre-charge operation.

* * * * *